(12) United States Patent
Neuilly et al.

(10) Patent No.: US 8,227,847 B2
(45) Date of Patent: Jul. 24, 2012

(54) ULTRA HIGH DENSITY CAPACITY COMPRISING PILLAR-SHAPED CAPACITORS FORMED ON BOTH SIDES OF A SUBSTRATE

(75) Inventors: Francois Neuilly, Colomby-sur-Thaon (FR); Francois Le Cornec, Luc sur Mer (FR)

(73) Assignee: NXP B.V., Eindhoven (NL)

( * ) Notice: Subject to any disclaimer, the term of this patent is extended or adjusted under 35 U.S.C. 154(b) by 81 days.

(21) Appl. No.: 12/918,773

(22) PCT Filed: Feb. 17, 2009

(86) PCT No.: PCT/IB2009/050643
§ 371 (c)(1), (2), (4) Date: Aug. 20, 2010

(87) PCT Pub. No.: WO2009/104132
PCT Pub. Date: Aug. 27, 2009

(65) Prior Publication Data
US 2011/0001217 A1    Jan. 6, 2011

(30) Foreign Application Priority Data
Feb. 20, 2008 (EP) .................................... 08290160

(51) Int. Cl.
*H01L 29/92* (2006.01)
(52) U.S. Cl. ............... 257/301; 257/532; 257/E29.342; 257/E29.346; 257/E21.008; 257/E21.396; 438/386; 438/389
(58) Field of Classification Search ............ 257/532
See application file for complete search history.

(56) References Cited

U.S. PATENT DOCUMENTS

| | | | |
|---|---|---|---|
| 5,204,280 A | 4/1993 | Dhong et al. | |
| 5,240,558 A | 8/1993 | Kawasaki et al. | |
| 5,245,505 A | 9/1993 | Shiga et al. | |
| 5,336,630 A | 8/1994 | Yun et al. | |
| 5,466,626 A | 11/1995 | Armacost et al. | |
| 5,474,950 A | 12/1995 | Kim | |
| 5,811,868 A * | 9/1998 | Bertin et al. | 257/516 |
| 6,236,103 B1 * | 5/2001 | Bernstein et al. | 257/532 |
| 6,465,331 B1 * | 10/2002 | Keeth et al. | 438/479 |
| 6,620,672 B1 | 9/2003 | Dennison et al. | |
| 7,704,881 B2 * | 4/2010 | Klootwijk et al. | 438/667 |
| 2002/0068369 A1 | 6/2002 | Scherer et al. | |
| 2003/0001232 A1 * | 1/2003 | Koinuma et al. | 257/532 |

(Continued)

FOREIGN PATENT DOCUMENTS

| | | |
|---|---|---|
| CN | 1809919 A | 7/2006 |
| EP | 0424623 A2 | 5/1991 |
| WO | 2004/114397 A | 12/2004 |

OTHER PUBLICATIONS

Roozeboom, F., et al; "High-Density, Low-Loss MOS Capacitors for Integrated RF Decoupling" Proceedings 34th Intl. Symposium on Microelectronics; Baltimore, Maryland, US; pp. 477-483; (Oct. 9-11, 2001).

(Continued)

*Primary Examiner* — Matthew W Such
*Assistant Examiner* — Abul Kalam

(57) ABSTRACT

The present invention describes an ultra High-Density Capacitor design, integrated in a semiconductor substrate, preferably a Si substrate, by using both wafer sides. The capacitors are pillar-shaped and comprise electrodes (930, 950) separated by a dielectric layer (940). Via connections (920) are provided in trenches that go through the whole thickness of the wafer.

6 Claims, 5 Drawing Sheets show the method steps forming a capacitor according to the invention

U.S. PATENT DOCUMENTS

| | | | |
|---|---|---|---|
| 2005/0135043 | A1 | 6/2005 | Palanduz et al. |
| 2006/0141793 | A1 | 6/2006 | Anceau |
| 2007/0018298 | A1 | 1/2007 | Gamand |
| 2007/0278619 | A1* | 12/2007 | Clevenger et al. ............ 257/532 |
| 2008/0280435 | A1* | 11/2008 | Klootwijk et al. ............ 438/667 |
| 2010/0118465 | A1* | 5/2010 | Onishi et al. .................. 361/271 |

OTHER PUBLICATIONS

Van De Riet, E., et al; "On the Origin of the Uniaxial Anisotrophy in Nanocrystalline Soft-Magnetic Materials"; American Institute of Physics; 9 Pages (1997).

Gaines, J.M., et al;"The (001) Surface of Fe3O4 Grown Epitaxially on MgO and Characterized by Scanning Tunneling Microscopy"; 8 Pages (1997).

Van De Riet, E., et al; "Ferromagnetic Resonance and Eddy Currents in High-Permeable Thin Films"; American Institute of Physics; 5 Pages (1997).

Ravindra, Nuggehalli M., et al; "Temperature-Dependent Emissivity of Silicon-Related Materials and Structures"; IEEE Transactions on Semiconductor Manufacturing, vol. 11, No. 1; 10 Pages (Feb. 1998).

International Search Report and Written Opinion for Application PCT/IB2009/050643 (Feb. 17, 2009).

* cited by examiner a top view of a capacitor according to the invention.

430

540

Figures 2a-h show the method steps forming a capacitor according to the invention a final wafer cross section

ULTRA HIGH DENSITY CAPACITY COMPRISING PILLAR-SHAPED CAPACITORS FORMED ON BOTH SIDES OF A SUBSTRATE

FIELD OF THE INVENTION

The present invention describes an ultra High-Density Capacitor design, integrated in a semiconductor substrate, preferably a Si substrate, preferably by using both wafer sides.

BACKGROUND OF THE INVENTION

High-Density Capacitors integrated in semiconductor substrates, especially on Si, are known in the art. They have been implemented mostly as trench (or pore) capacitors for applications as RF supply-line decoupling, phase-locked loop filtering and, even more abundantly, for trench capacitors for DRAM memories. Typical capacitance densities of capacitors obtained so far here are in the order of 25 $nF/mm^2$, but are expected to increase to 70 $nF/mm^2$ in the near future, which capacitors comprise a dielectric ONO layer, when reducing the ONO-based layer thickness to ~15 nm. For DRAM applications the density is expressed in $fF/\mu m^2$ and is—for logic technology reasons—comparable. These capacitance densities are for many applications not high enough. So there is a need for capacitors with higher densities.

Pillar capacitors in a semiconductor device have been developed to increase capacitor density.

US2002/068369 A1 discloses a method of fabricating electrically passive components or optical elements on top or underneath of an integrated circuit by using a porous substrate that is locally filled with electrically conducting, light emitting, insulating or optically diffracting materials. It is directed to a method of fabricating electrically passive components like inductors, capacitors, interconnects and resistors or optical elements like light emitters, waveguides, optical switches of filters on top or underneath of an integrated circuit by using porous material layer that is locally filled with electrically conducting, light emitting, insulating or optically diffracting materials. In the illustrated embodiment the fabrication of voluminous, solenoid-type inductive elements in a porous insulating material by standard back- and front-side-lithography and contacting these two layers by electroplating micro-vias through the pores is described. By using a very dense interconnect spacing, an inter-pore capacitor structure is obtained between the metalized pores and the pore walls utilized as insulators.

It is noted that a method is disclosed to make a 3D coil. The present invention is using semiconductor deposition to make the passives and the sidewall connection between front side and back side. In fact, the US patent is only mentioning a way to connect front side and backside, which is something different.

EP0424623 A2 discloses three-dimensional semiconductor structures in which various device types are formed from a plurality of planar layers on a substrate. The major process steps include the formation of a plurality of alternating layers of a material, including semiconductor and dielectric materials, forming a vertical access hole in the layers, processing the layers selectively to form active or passive semiconductor devices, and filling the access hole with a conductor. The ultimate structure includes a three-dimensional memory array in which entire dynamic memory cells are fabricated in a stacked vertical orientation above support circuitry formed on a planar surface.

It is noted that to make the horizontal layer, EP0424623 needs to make a sandwich of different layers. In order to further increase a capacity density, EP0424623 needs to add more and more layers and etch a stack that is thicker and thicker. In the present invention, in order to further increase the density, one can only etch deeper and deeper, without adding a new sandwich of a different layer.

US2005135043 A2 discloses a base structure which is formed from a green material having first and second opposing sides and having a plurality of via openings therein. The green material is then sintered so that the green material becomes a sintered ceramic material and the base structure becomes a sintered ceramic base structure having the via openings. A conductive via is formed in each via opening of the sintered ceramic base structure. First and second capacitor structures are formed on the sintered ceramic base structure, each on a respective side of the sintered ceramic base structure. The power and ground planes of the capacitor structure are connected to the vias. As such, a capacitor structure can be formed and connected to the vias without the need to drill via openings in brittle substrates such as silicon substrates. Capacitor structures on opposing sides provide more capacitance without manufacturing complexities associated with the manufacture of one capacitor structure having a large number of power and ground planes.

U.S. Pat. No. 6,620,672 B1 discloses a method of fabricating a memory cell in which an access transistor is first formed on an SOI substrate. The access transistor contains source and drain regions in a semiconductor material layer of the substrate and at least one gate stack which includes a gate region electrically connected with a word line. At least one capacitor is formed con a first side of the substrate and is electrically connected to one of the source and drain regions. At least one bit line conductor is formed on the reverse or flip side of the substrate, wherein the bit line conductor is electrically connected to the other of the source and drain regions. Self-aligned contact openings are formed through insulating material over the substrate to provide vias for the electrical connections for each of the capacitor and bit line conductor. These contact openings and the deposited contact material are substantially preserved throughout the entire fabrication process.

Further capacitor structures may be found in U.S. Pat. No. 5,204,280A1 (IBM, 1993), U.S. Pat. No. 5,240,558A (Motorola, 1993), U.S. Pat. No. 5,245,505A (Sumitomo, 1993), U.S. Pat. No. 5,336,630A (Goldstar, 1994), U.S. Pat. No. 5,466,626A (IBM, 1995), and U.S. Pat. No. 5,474,950A (Hyundai, 1995).

There are different parameters to play with to increase the 3D capacitance density. Making narrower or deeper pillar structures is an option, but the increase in aspect ratio makes the structures more mechanically fragile and not attractive in terms of cost. The use of other dielectric material, like high k, is an alternative solution, but again make this option expensive due to the process technology used therein. Other structures, like multiple capacitance, can only achieve high capacitance density at the expense of increasing the number of process steps.

Thus, there still is a need to provide capacitors with higher density, which do not have one or more of the above disadvantages.

SUMMARY OF THE INVENTION

The present invention describes a High-Density Capacitor design, integrated in semiconductor (in particular Si) substrate by using both wafer sides, as well as a method of manufacturing said capacitors, and uses thereof. The 3D capacitors, which are formed into pores, multi-lobe pillars structures, or trenches and any other 3D shape structures, are realized on both sides of the wafer. The materials constituting the conductor-dielectric-conductor layer stack (which can be multiple) have been selected to allow the simultaneous treatment of both the wafer sides, and to propose a low cost process. Both sides of the wafer are electrically connected to each other, with a through wafer via connection, filled up with the same or similar conductor-dielectric-conductor layer stack as the 3D capacitors. Also these capacitive through vias contribute to the overall capacitance value. The combination of this double pored or pillared side substrate concept to a multiple capacitor layers stacks comprises an Ultrahigh-density capacitor with area capacitance typically exceeding 400 $nF/mm^2$. Further, this is achieved by a low cost process.

The present invention takes advantage of 3D capacitor structures, to make through wafer vias during pore etching. The deposition of electrode and isolation material, respectively, is used to make a connection between a front side and a backside of the wafer simultaneously.

DETAILED DESCRIPTION OF THE INVENTION

In a first aspect the invention relates to a semiconductor device with an ultra high density capacity, comprising a silicon substrate (900), more than one pillar like structure (910), preferably more than one pillar like structure on each side of the silicon substrate, at least one trench (920), preferably being a through substrate trench, a capacitor top electrode contact (981), and a capacitor bottom electrode contact (982), wherein the pillar structure comprises, seen from core to shaft, inner conductive material (950), dielectric material (940), and outer conductive material (930), preferably being doped silicon, wherein the trench comprises, seen from center to wall thereof, inner conductive material (950), preferably being poly silicon, dielectric material (940), and outer conductive material (930), preferably being doped silicon.

It is noted that the process could be asymmetric in nature. The pillars could in principle be on one side only, as an alternative to the above. In the case that the wafer is thin enough or that the etch is long enough, when manufacturing the device, the through wafer via etch may go through the complete wafer in one go. So the through wafer via connection is in that case performed without a backside etch. This, as such, may be useful to make a connection on a backside, instead of on a front side. In this case a front side would be used for capacitors and a backside would be used for a connection.

Clearly, the pillars cannot be through the complete via, because they would fall down, as they would not be connected anymore to the substrate. The capacitors could be made of holes, and in that case, capacitors could go through the via. The present case is such that capacitors and through wafer via have a similar diameter, so that the etch depth is similar for vias and capacitors holes, respectively. In this particular case, the through wafer via may not really be needed, as each single capacitor holes acts as a through wafer via connection.

It is noted that one or more of the trenches may extend through the wafer, considering a trench as an original through wafer via. In such a case, the non-extended trench acts as a trench capacitor, similar to a pillar designed as a 3D capacitor.

The core of e.g. a pillar, is of a conductive material, and as such it allows an electrical current to pass through relatively easy. Preferably doped silicon is used for bottom and top electrodes, respectively. An advantage thereof is that it fits well with existing processes. Further, as such, both sides may be simultaneously processed, which clearly attributes to reduced costs, improved throughput time and improved quality.

Typically, the inner conductive material of the one or more pillar like structure is mutually electrically connected to each other. Also typically, the outer conductive material of the one or more pillar like structure is mutually electrically connected to each other. Further, the inner conductive material and the outer conductive material of the at least one trench is electrically connected to the inner conductive material and the outer conductive material of the one or more pillar like structure, respectively.

Typically, top and bottom electrodes are separately connected, as is the case in a standard capacitor.

An advantage of the present invention is that the capacitors have a huge surface area. Another main advantage is the fact that, from a processing point of view, both sides of the wafer can be processed simultaneously.

The density of the capacitor obtained is typically larger than 70 $nF/mm^2$, preferably larger than 150 $nF/mm^2$, more preferably larger than 250 $nF/mm^2$, even more preferably larger than 400 $nF/mm^2$, such as larger than 600 $nF/mm^2$ or even larger than 1 $\mu F/mm^2$. As such, the present invention has increased, by more than a factor 2, the capacitance density values reached with in the prior art, e.g. with current PICS technology, by using both sides of the silicon wafer, and by making a via connection filled with the capacitance stack. The pillar like structure may have a circular form, an oval form, a rectangular form, such as a square form, a hexagonal form, an octagonal form, etc., or combinations thereof, preferably a circular form.

Typically the pillar like structure has a total diameter of 0.1-10 µm, preferably from 0.5-5 µm, more preferably from 0.8-3 µm, such as 2 µm. Clearly, the diameter and perimeter of a pillar structure are related by a factor $\pi$. Further, the pillar structure has a height of 30-900 µm, preferably from 50-600 µm, more preferably from 80-500 µm, such as 300 µm.

It is noted that a capacitor value is equal to $\epsilon_0 \epsilon_r A/d$. The pillar capacitor plays with its 3D-structure to increase the electrode surface area: $A = P \cdot h$, wherein P is the perimeter of the pillar and h is the pillar height. Thus, increasing the diameter, or equivalently perimeter, and/or increasing the height of the pillar, will, as a result, increase the capacitor value. However, if the diameter becomes too large, this is at the expense of the number of pillars per unit area.

The width of a trench is preferably of the same order of magnitude as the distance between two pillars in order to avoid filling problem. Typically the distance between two pillars if from 0.1-5 times the diameter thereof. Thus the width of the trench is preferably from 0.5 to 4.0 times the inter pillar distance, more preferably from 0.8 to 1.5 times, most preferably from 0.9 to 1.1, such as being equal. If the width is larger, for instance to increase the etch rate, as a consequence poly deposition should also be increased, which deposition is used to close the trenches as well. In other words, larger trenches help to increase the etch rate and depth, but in the other hand, filling and closing of a hole thus obtained clearly requires deposition of a thicker top electrode, consisting of conductive material. In another case however, the width could be larger if patterning on non-completely filled trenches is not an issue.

The conductive layer typically has a thickness from 0.03-3 µm, preferably from 0.1-1.5 µm, more preferably from 0.2-1 µm, such as 0.3 µm.

The trench is preferably a long trench, which trench is used for through the wafer via connections. Thus, the length of the trench is preferably larger than twice the pillar diameter, more preferably larger than 4 times the pillar diameter, even more preferably larger than 6 times the pillar diameter, even more preferably larger than 8 times the pillar diameter, such as larger than 10 times the pillar diameter.

Advantages of the present invention are the formation of a double sided 3D high density capacitor, as described above.

At the same time, without extra processing steps, thus without extra process time, and without extra costs, through wafer via connection are formed.

A further advantage is the provision of a very low cost process, because of the following features:

The dielectric and the electrode materials are deposited simultaneously on both wafer sides.

The capacitances built up on front side and back side are electrically connected by the through wafer via, and therefore, only the front side metal connection is needed to contact the capacitor electrodes (no need of backside metal deposition).

A next advantage is the simplicity of the present process, due to the symmetry between the front side and the backside of the wafer, e.g. relating to capacitance definition.

A further advantage is that the present invention can be combined with various other ways of increasing capacitance density, like the use of High K material as dielectric, MIMIM structures, etc.

The present invention is further compatible with other through wafer designs. It is noted that, for instance, through wafer vias can be realized for other purposes than connecting both side capacitors, such as for forming an external connection, a 3D coil, etc.

Also different designs are possible. It is noted that the present invention is relatively design independent. For instance, there is no need for a symmetrical capacitor, i.e. a large capacitor may be present on the front side, whereas a small capacitor may be present on the backside, or vice versa.

Further, the present capacitor can be made in a low cost process. There is no need of adding one or more layers or process steps in order to improve performance with respect to prior art.

The capacitor comprises a top electrode contact, as well as a back electrode contact, preferably comprising a conductive material such as doped poly silicon, a metal, such as aluminum, copper, tungsten, preferably doped polysilicon. The top electrode may be situated at a first side of the substrate, whereas the back electrode may be situated at the other side, or both being situated at a same side.

The connection of the front side to the backside of the wafer through a via hole, filled up with the conducting electrode material, is a new low cost solution to increase the capacitor density value.

In a preferred embodiment the top electrode contact is connected to the inner conductive material, and the bottom electrode contact is connected to the outer conductive material. The connection may also be vice versa.

In a preferred embodiment the at least one trench is designed in a such way that, after etching, the total open area of the at least one trench is bigger than the capacitor area. This is done to generate a difference in the depth of trenches and PICS area thanks to the ARDE (Aspect ratio dependant etching) phenomenon. In other words, for a hole with a relatively large diameter, the hole surface could, in an approach, be considered to be infinite. On the contrary, for a hole with a small diameter, volatile species have difficulties to get out of such a hole, for instance because of collision between species. As a consequence, typically the etch rate drops. As a result smaller holes are relatively less deep than larger trenches. This phenomenon is known as Aspect ratio Dependent Etch (ARDE).

In a second aspect the invention relates to a device, such as a MEMS, a microbattery, an integrated capacitor, a Si-integrated component, where enhanced surface is requested in applications, such as RF supply-line decoupling, phase-locked loop filtering, power management such as DC-DC conversion, back-up power such as integrated battery' supply, such as in the μWatt domain in ambient intelligence, or combinations thereof, comprising a semiconductor device according to the invention. The present invention applies in principal to any application that requires a dry etch for surface development increase, and subsequent filling steps, with dielectric and conductive materials. As such, the present invention allows a major step towards the increase of density.

In a third aspect the invention relates to a mobile application comprising a device according to the invention and or a semiconductor device according to the invention.

It is noted that for mobile applications, packaging is one of the biggest challenges. Increasing the device density is a key parameter for any application in this area. The present invention is in the scope of any silicon in package application (SIP). FIG. 3 provides an example of a SIP, both with a 1-sided connection and a 2-sided connection example. With a 2-sided connection, it is possible to stack dices above each other, in order to further increase densities.

In a fourth aspect the invention relates to a method of manufacturing a semiconductor device according to the invention, comprising the steps of:

providing a silicon wafer (900), forming at least one trench (110) and pillar holes (120) on one side of the wafer, forming at least one trench (110) and pillar holes (120) on the other side of the wafer, whereby trenches go through the wafer, doping the silicon (930), to create a first electrode, which may be referred to as the bottom electrode, which reference is both applicable for a front and a back side of a wafer, and simultaneously create a front side and back side connection, typically in a via, forming a layer of dielectric material (940) on both sides of the wafer, and thus also into the through wafer via, and holes, forming a poly silicon layer on both sides of the wafer, to create a second electrode and simultaneously create a front side and back side connection, typically in a via, etching a first side of the wafer, in order to pattern a top electrode (760), optionally etching a second side of the wafer, in order to pattern a top electrode (870) on the second side of the wafer, and forming contacts (981, 982).

Contacts are typically formed on top and bottom electrodes only on one side of the wafer, as there is a connection to the second side with the through wafer via. Optional subsequent steps are e.g. deposition of an isolation layer (by PECVD oxide), patterning of the isolation layer (by a litho and an etch step), in order to form contact on electrodes. Thereafter, metal deposition and metal patterning may be performed to make interconnects. These processes are standard operations for semi-conductor industry.

The present invention is further elucidated by the following Figures and examples, which are not intended to limit the

DETAILED DESCRIPTION OF THE DRAWINGS

Figure 1:
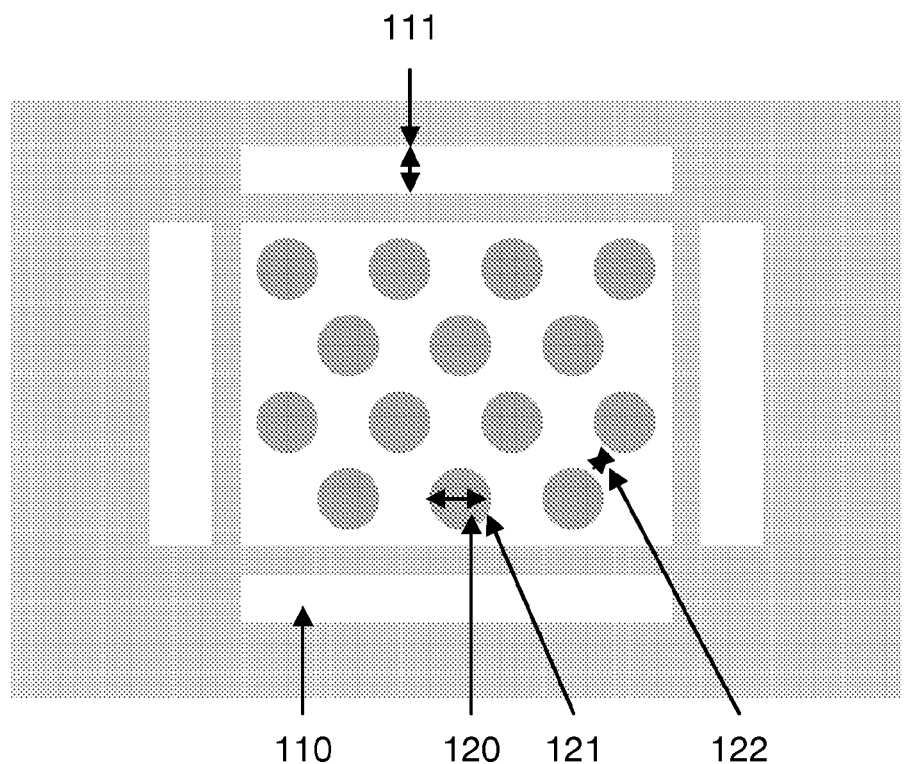
FIG. 1 shows a top view of a capacitor according to the invention.

FIG. 1 shows a top view of a capacitor according to the invention, comprising circular pillar holes (120) and trenches (110) as an example of design. The circular pillar holes have a diameter (121), and have a pitch (122), the pitch being defined as the shortest distance between to pillars. The arrangement of the pillar holes may be in a diamond or hexagonal form, as is shown in FIG. 1, in a square form, in a triangular form, but preferably in a hexagonal form. The trenches (110) have a width (111). The length of the trenches is typically such that the area occupied by the pillars (120) is substantially surrounded by a trench, i.e. four trenches at either side of the area in FIG. 1. Depending on the layout of the area, trenches may also form a triangle or a rectangle, respectively, as the case may be, if the area itself forms such a triangle or rectangle, respectively. The width of the trenches (111) is typically in the same order of magnitude as the pitch (122) between two pillars, e.g. from 0.5 to 2 times said distance, such as approximately the same distance, in order to avoid a filling problem. If it is larger, for example to increase the etch rate, subsequent deposition of e.g. poly silicon should be increased to close the trenches also. The long trenches are used for through wafer via connections.

FIG. 2a-h show the method steps of forming a capacitor according to the invention.

Figure 2A:
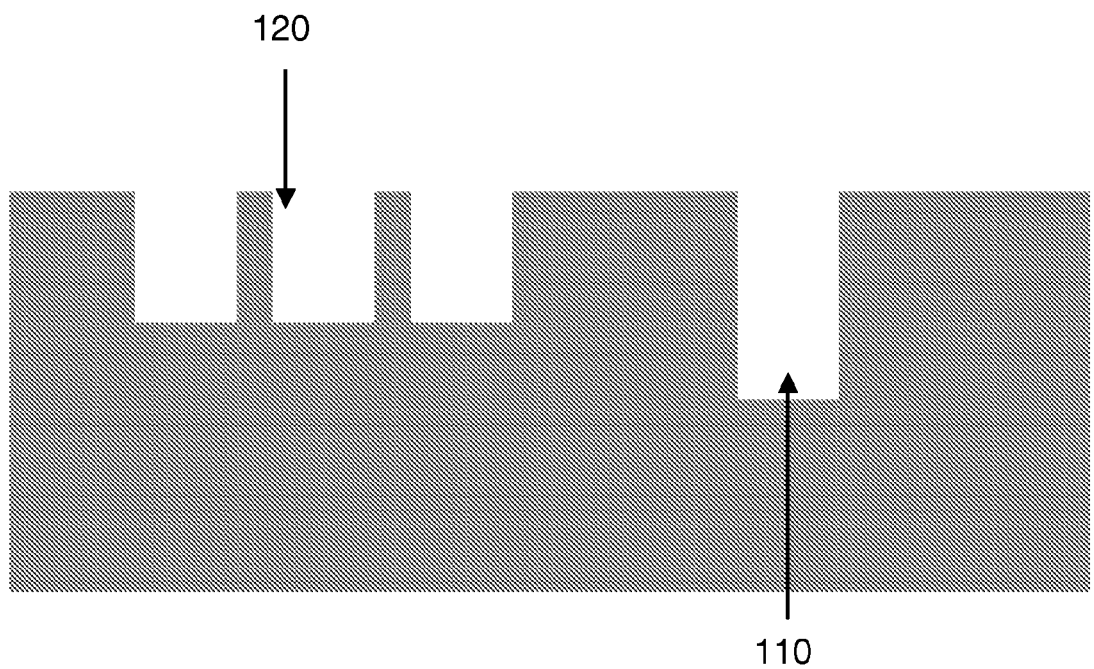
FIGS. 2a-h show method steps of forming a capacitor according to the invention.

In FIG. 2a a silicon wafer is provided. At a front side thereof trenches (110) and holes (120) were etched. These holes will in subsequent process steps be formed into pillars, whereas the trenches will be used to form through wafer vias. Thus it is composed of two parts, namely an area of pillars (as such not visible in FIG. 2), to make 3D capacitors, and some trenches, to make via connections, which connections go through the wafer. It is noted that the pillars have approximately half of the depth of the vias and are simultaneously etched by using the same litho mask. As the Si etch rate depends on the aspect ratio, the through wafer via connection is a trench and not a hole, in order to etch deeper than the holes for the pillars structures. The trenches can be wider than the distance between the pillars to further increase the etch rate, but the filling steps will be adjusted such that both structures are correctly filled up. Via etch should preferably stop at about the half of the wafer thickness. Typically the etch is done using a mask by a dry etch process in 2 steps, first a anisotropic etch (vertical etch), then a second step using an isotropic etch (in all direction, so also horizontal). The anisotropic etch is done by using a polymerizing recipe that forms a passivation layer, to protect sidewalls. The isotropic etch is done by removing this passivation step, using only chemical etch (for silicon, $SF_6$ is a good chemistry to achieve that).

Figure 2B:
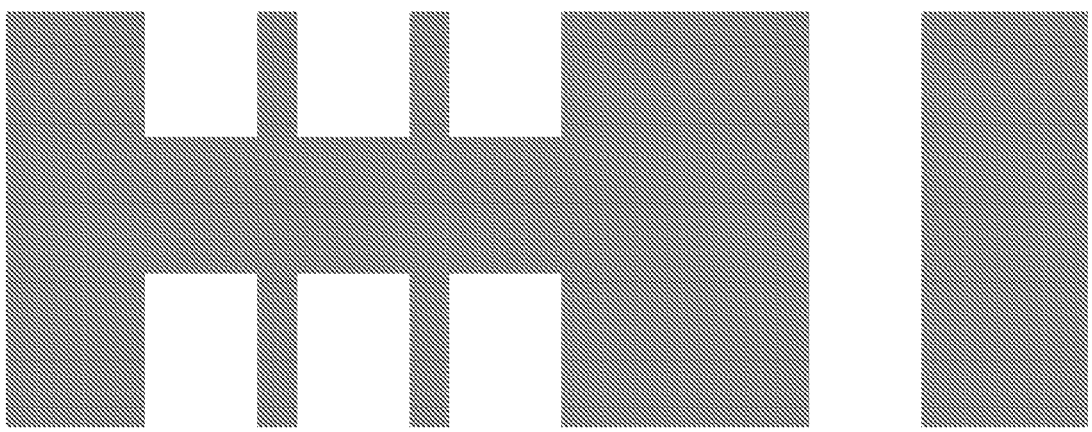

In FIG. 2b trenches and pillars were formed on the other side of the wafer, whereby trenches go through the wafer. This deep silicon-etching step is in fact re-iterated on the wafer backside, it used the same recipe as for the front side, to define a new 3D capacitance area and to finish the via connection.

Figure 2C:
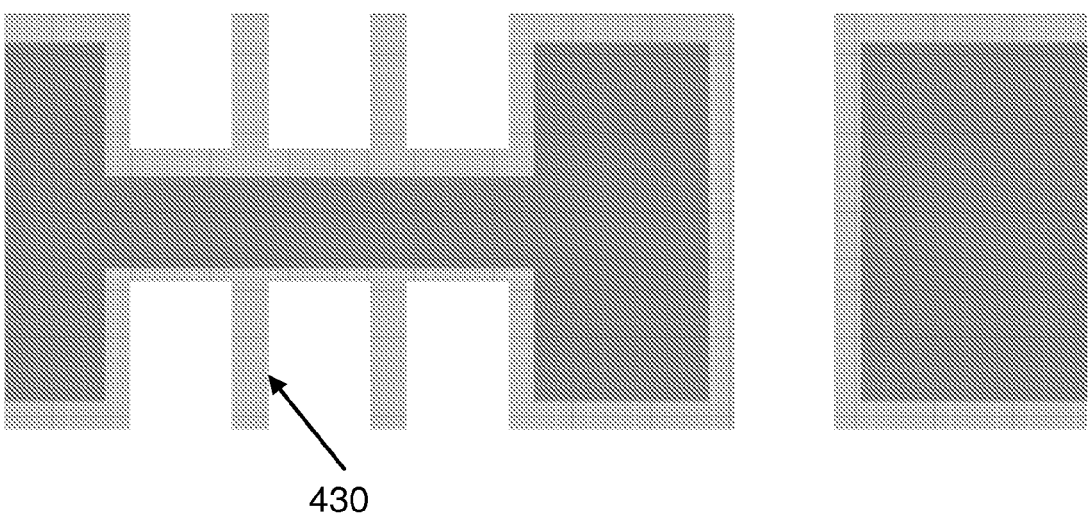

In FIG. 2c the silicon was doped (430), to create a first electrode and simultaneously create a front side and back side connection. The electrode formation is simultaneously done on both sides of the wafers. Similarly to a conventional PICS process, a first capacitor electrode is formed by depositing a boron-doped glass, followed by a diffusion step to dope the opened silicon areas. Performed in LPCVD furnaces, these process steps allow the treatment of both sides of the wafer in "one shot". The doping concentration typically depends on the application. It is noted that higher concentrations make silicon more conductive.

Typically, it is optional that after a doping step a thermal step is performed, in order to further diffuse the dopants and activate these.

Figure 2D:
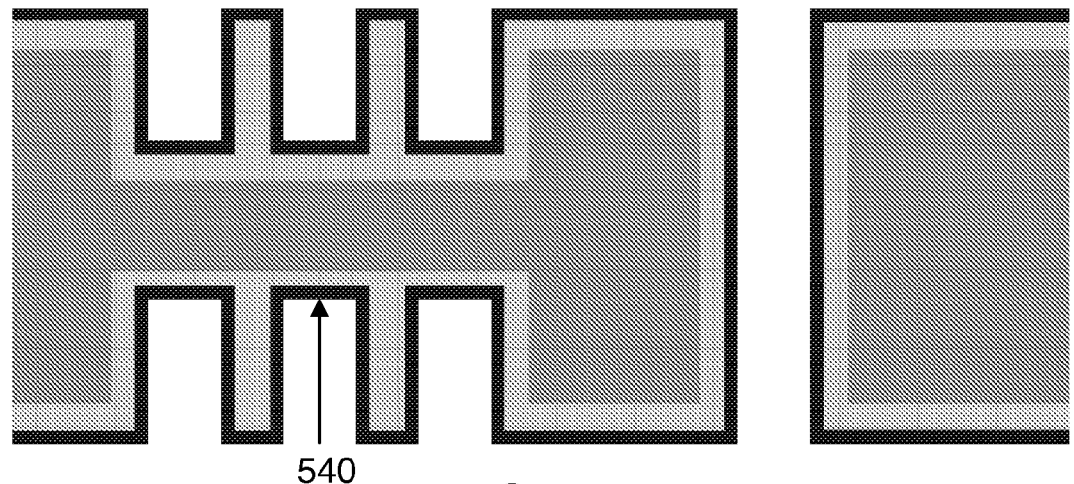

In FIG. 2d a layer of dielectric material (540) was formed on both sides of the wafer.

Figure 2E:
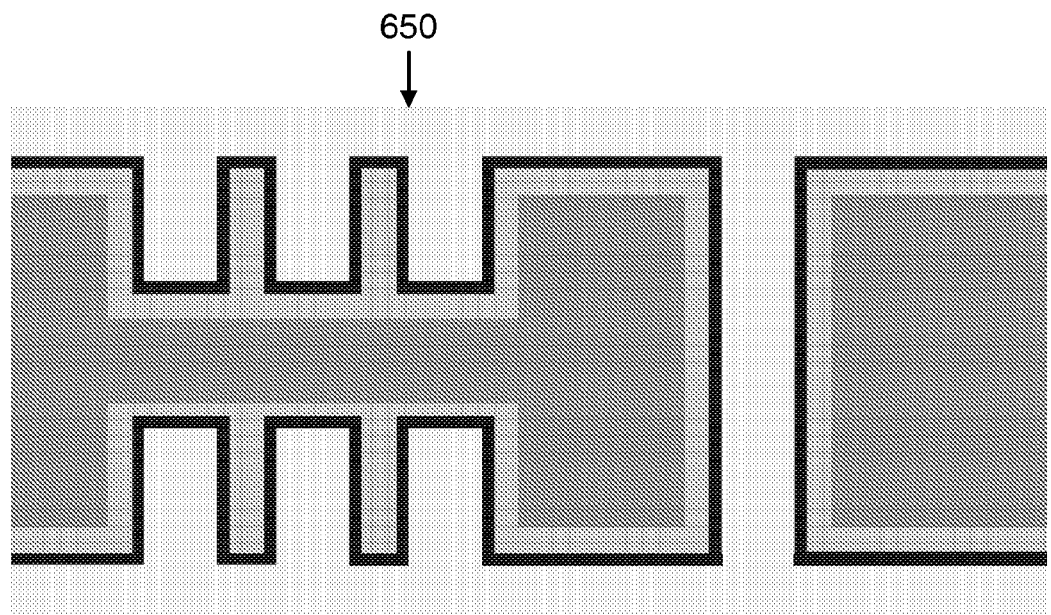

In FIG. 2e a poly silicon layer (650) on both sides of the wafer was formed, to create a second electrode and simultaneously create a front side and back side connection. As the poly silicon is doped, the isolated vias are electrically active (conducting) and allow the connection between the front and the backside of the wafer. In addition, they have strictly the same structure as the 3D capacitors, and therefore, contribute to the overall capacitance values. Typical values for a PICS process are dopant concentration of around $2e^{20}$ Atoms/cm$^3$. It is noted that the concentration should be high enough to get the device working.

Figure 2F:
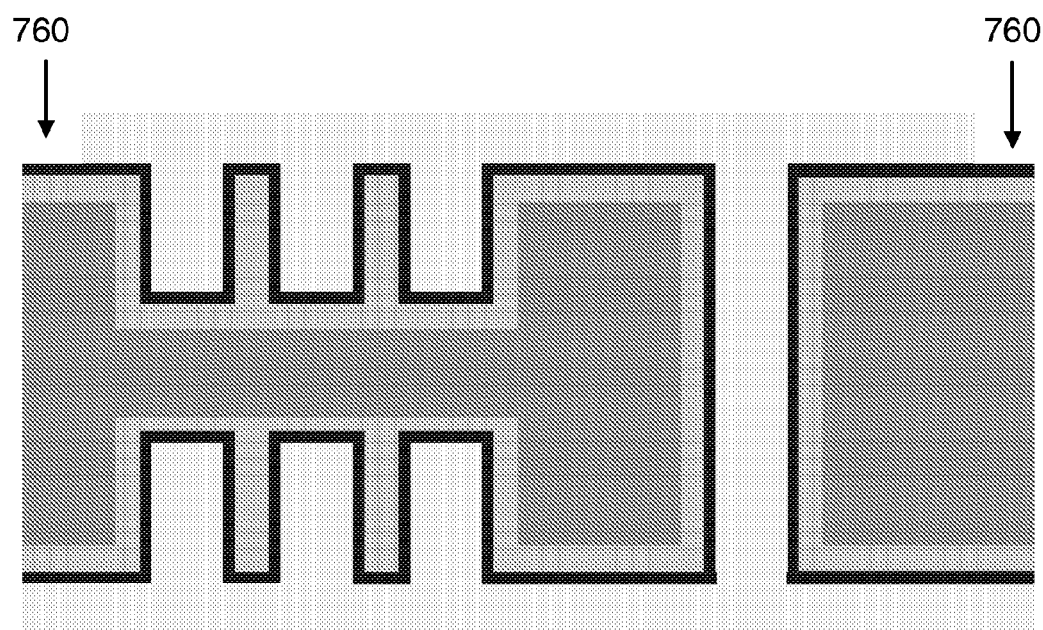
Figure 2G:
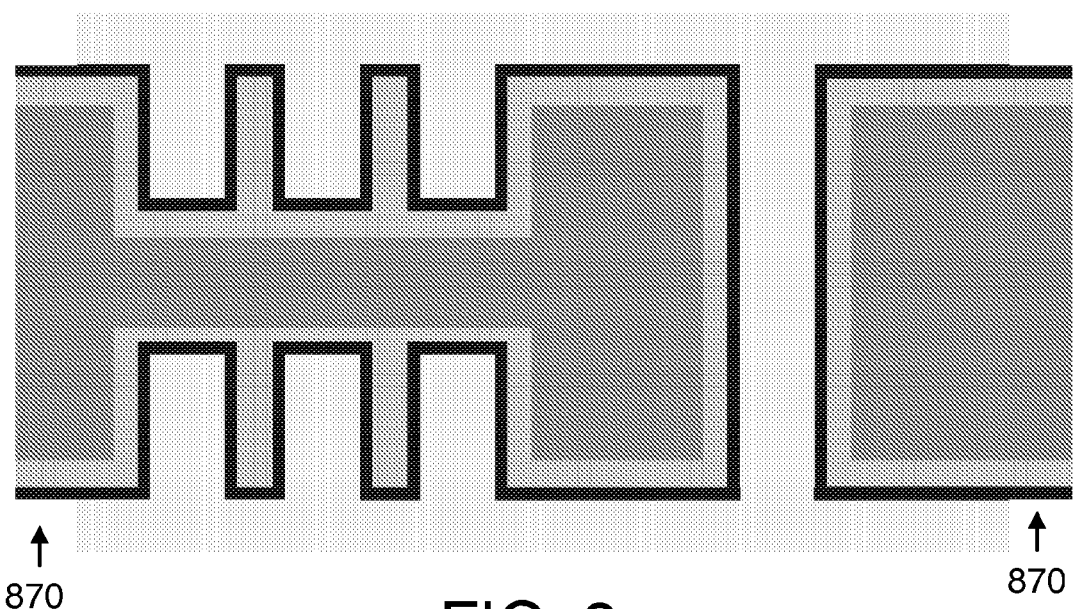

In FIG. 2f a first side of the wafer was etched, to pattern the top electrode (760) on one side, and in FIG. 2g a second side of the wafer was etched, to pattern an optional backside electrode (870) on the other side.

Figure 2H:
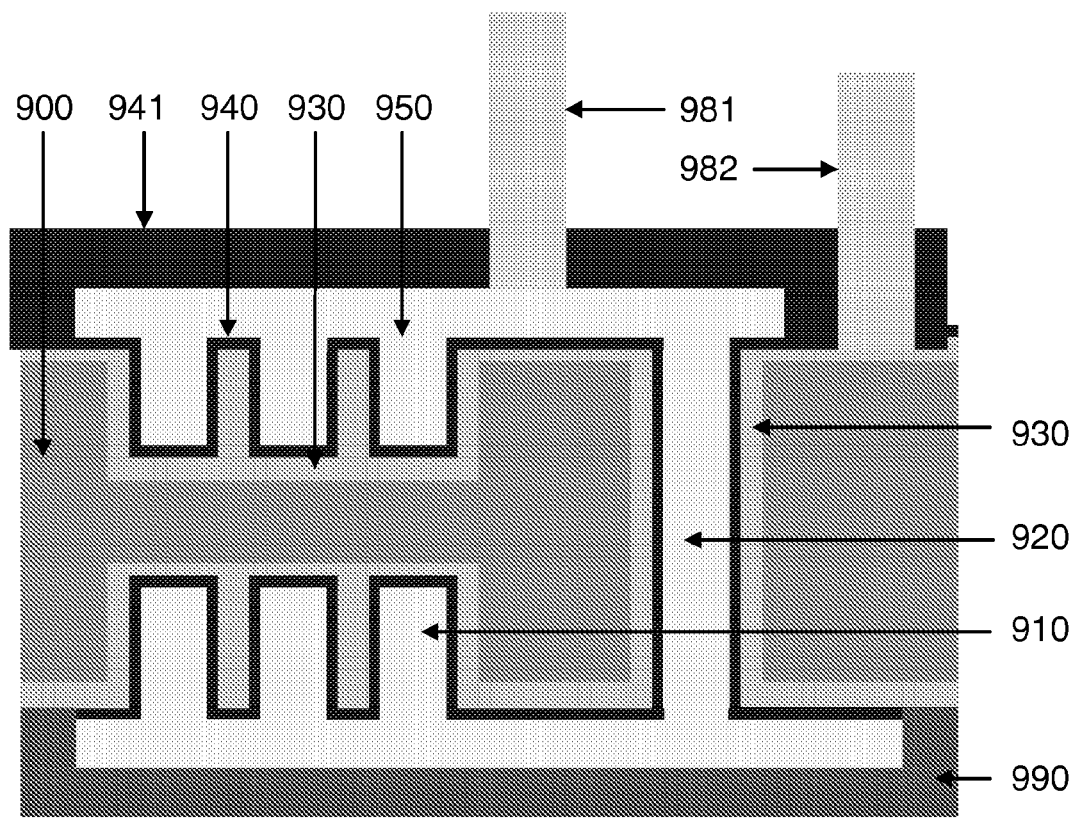

In FIG. 2h contacts (981) and (982) were formed. The contacts are typically formed from conducting material, such as aluminum (by e.g. PVD), tungsten (by e.g. CVD), or copper (by e.g. ECD). A first contact (981) is connected to the poly silicon layer (950), whereas a second contact (982) is connected to a continuous dope Si substrate (930), or vice versa. The isolation layer (941) deposited on the front side of the wafer is typically performed by PECVD oxide, which is performed on 1 side only. Typically, there may be no deposition or any other processing needed on the backside of the wafer, for the device to work. However, for a certain process, and in order to avoid particles issues on the backside, a passivation layer (990) could be put on the backside to protect the surface, typically a PECVD nitride. This step would be added after backside top electrode patterning and before isolation deposition on the front side.

Thus, FIG. 2h shows the result of ultra high density capacitors after processing. (900) is the original Si substrate, (930) the doped Si substrate, (940) a first dielectric layer, (941) a second dielectric layer, (950) a poly silicon layer, (981) and (982) two contacts for electrodes, respectively, and (990) a backside passivation layer.

As an alternative to FIG. 2h, specifically applicable to thin silicon substrate, the pillars may be on one side of the wafer only. As such, a through wafer via etch can be provided in one process step, thereby eliminating a need of a backside (dry) etch step. As such, a contact may be place on the backside, but than a backside etch is necessary.

As a further alternative, to the alternative embodiment, capacitor or pillar holes may also go through the wafer, forming trough wafer vias.

Figure 3:
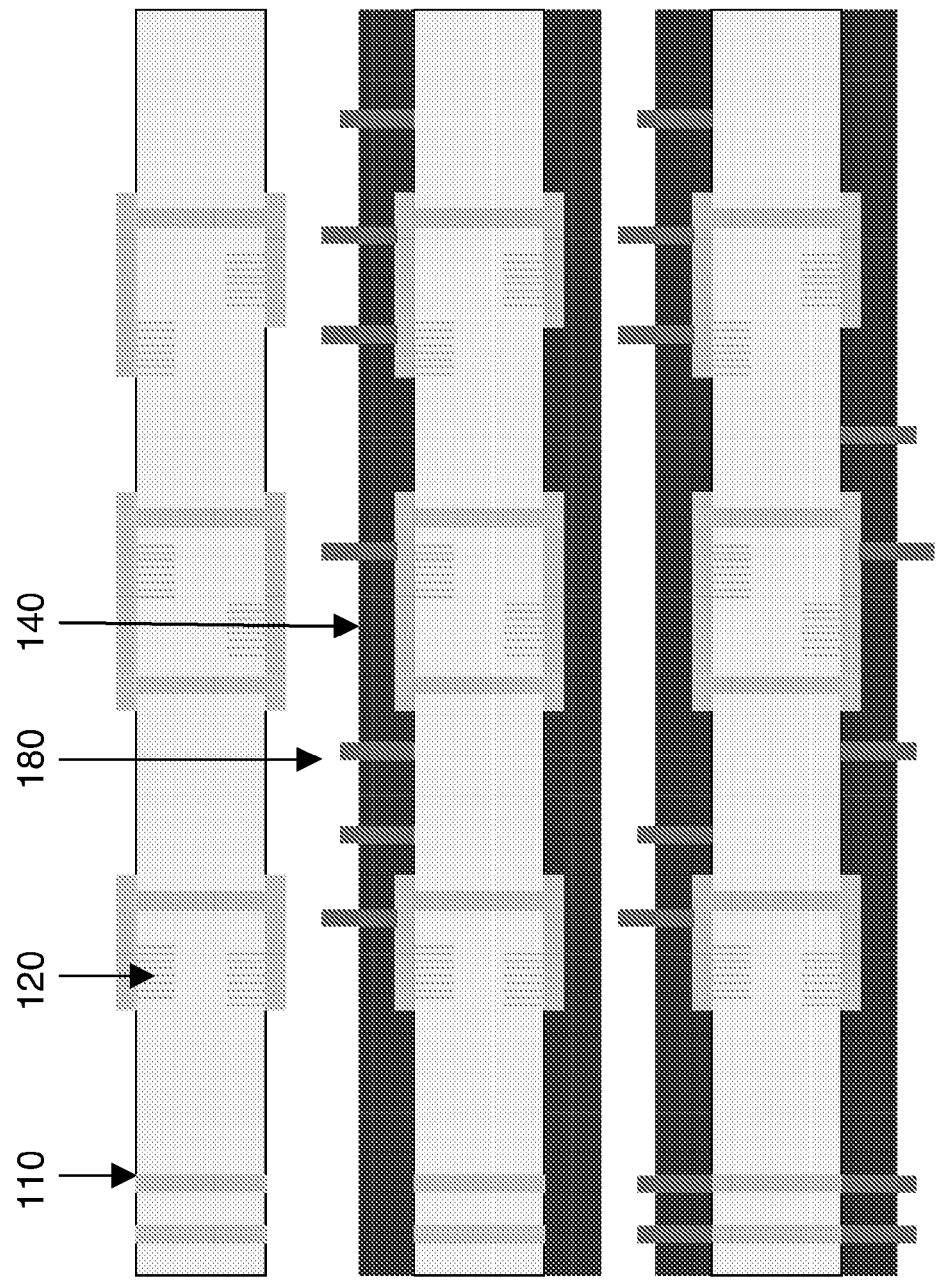
FIG. 3 shows a final wafer cross section.

FIG. 3 shows a final wafer cross section, showing pillars (120), trenches (110), contacts (180) and a dielectric layer (150).

The invention claimed is:

1. Semiconductor device with an ultra high density capacitor, comprising a silicon substrate, more than one pillar like structure on the front side and back side of the silicon substrate, at least one trench extending through the substrate, a capacitor top electrode contact, and a capacitor bottom electrode contact, wherein the pillar structures comprise, seen from core to shaft, an inner conductive material, a dielectric material and an outer conductive material, wherein the trench comprises, seen from center to wall thereof, the inner conductive material, the dielectric material and the outer conductive material,
   wherein the inner conductive material is poly silicon and the outer conductive material is doped silicon, and
   wherein the top electrode contact is connected to the inner conductive material and the bottom electrode contact is connected to the outer conductive material.

2. Semiconductor device according to claim 1, wherein the width of the trench is from 0.5 to 2.0 times the shortest distance between the doped silicon of two adjacent pillars.

3. Semiconductor device according to claim 1, wherein the at least one trench is designed in a such way that the total open area of the at least one trench is bigger than the capacitor area.

4. A device selected from the group consisting of a MEMS device, a microbattery, integrated capacitors, and a Si-integrated component, the device comprising a semiconductor device according to claim 1.

5. A mobile application comprising a device according to claim 4 and/or a semiconductor device according to claim 1.

6. Method of manufacturing a semiconductor device according to claim 1, comprising:
   providing a silicon substrate,
   forming at least one trench and pillar holes on one side of the silicon substrate,
   forming at least one trench and pillar holes on an other side of the silicon substrate, whereby trenches go through the silicon substrate,
   doping an outer surface of the silicon substrate, to create a first electrode, which is referred to as a bottom electrode, which reference is both applicable for a front and a back side of silicon substrate, and simultaneously create a front side and back side connection as a via,
   forming a layer of dielectric material on both sides of the silicon substrate, and thus also into the via, and the pillar holes,
   forming a poly silicon layer on both sides of the silicon substrate, to create a second electrode and simultaneously create a front side and back side connection in the via,
   etching a first side of the silicon substrate, in order to pattern a top electrode,
   etching a second side of the silicon substrate, in order to pattern a top electrode on the second side of the wafer, and
   forming contacts to the electrodes.

* * * * *